United States Patent
Tseng et al.

(10) Patent No.: US 7,629,842 B2
(45) Date of Patent: Dec. 8, 2009

(54) CLASS D AUDIO AMPLIFIER

(75) Inventors: Kuan-Jen Tseng, Sinshih Township, Tainan County (TW); Po-Yu Li, Sinshih Township, Tainan County (TW)

(73) Assignee: Himax Analogic, Inc. (TW)

( * ) Notice: Subject to any disclaimer, the term of this patent is extended or adjusted under 35 U.S.C. 154(b) by 16 days.

(21) Appl. No.: 12/049,578

(22) Filed: Mar. 17, 2008

(65) Prior Publication Data

US 2009/0231035 A1   Sep. 17, 2009

(51) Int. Cl.
    *H03F 3/38* (2006.01)
(52) U.S. Cl. .......................................... 330/10
(58) Field of Classification Search .................. 330/10, 330/207 A, 281; 381/94.5
    See application file for complete search history.

(56) References Cited

U.S. PATENT DOCUMENTS 5,973,368 A * 10/1999 Pearce et al. ................. 257/368

* cited by examiner

*Primary Examiner*—Robert Pascal
*Assistant Examiner*—Khiem D Nguyen
(74) *Attorney, Agent, or Firm*—Hayes Soloway P.C.

(57) ABSTRACT

A class D audio amplifier includes an error amplifier, a comparator, a bridge circuit, a feedback circuit and a silent start circuit. The error amplifier generates an error signal by amplifying a difference between a feedback signal and an audio input signal. The comparator generates a first pulse width modulation (PWM) signal by comparing a first triangular-wave signal and the error signal. The bridge circuit has switches alternately conducting a current flowing into and from a load. The feedback circuit generates the feedback signal indicating a condition of the load. The silent start circuit performs AND operation of the first PWM signal and a second PWM signal having a gradually increased duty ratio to generate a third PWM signal for control of the switches of the bridge circuit.

7 Claims, 3 Drawing Sheets

CLASS D AUDIO AMPLIFIER

BACKGROUND

1. Field of Invention

The present invention relates to an audio amplifier. More particularly, the present invention relates to a class D audio amplifier.

2. Description of Related Art

An audio system generally consists of three parts. The first part is an audio source, such as a tape player, a disc player or an RF tuner, for retrieving audio information and converting it into an electrical signal. The second part of the audio system is a loudspeaker. The loudspeaker converts electrical signals into acoustic waves to be perceived by a listener. The third part of the audio system is a power amplifier. The power amplifier amplifies the electrical signals from the audio source and supplies the necessary current to drive the loudspeaker.

However, an overly high DC current is often suddenly generated and also flows into the load, i.e. loudspeaker, when the power is turned on to start the audio power amplifier. Therefore, the load could be damaged because of the suddenly generated DC current, and a popping noise is also produced at the same time based on the suddenly generated DC current.

SUMMARY

In accordance with one embodiment of the present invention, a class D audio amplifier is provided. The class D audio amplifier includes an error amplifier, a comparator, a bridge circuit, a feedback circuit and a silent start circuit. The error amplifier generates an error signal by amplifying a difference between a feedback signal and an audio input signal. The comparator generates a first pulse width modulation (PWM) signal by comparing a first triangular-wave signal and the error signal. The bridge circuit has switches alternately conducting a current flowing into and from a load. The feedback circuit generates the feedback signal indicating a condition of the load. The silent start circuit performs AND operation of the first PWM signal and a second PWM signal having a gradually increased duty ratio to generate a third PWM signal for control of the switches of the bridge circuit.

For the foregoing embodiment of the present invention, the class D audio amplifier can be applied to avoid the overly high DC current, to prevent the load from being damaged, and to reduce the popping noise when the audio amplifier starts.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference made to the accompanying drawings as follows.

DESCRIPTION OF THE PREFERRED EMBODIMENTS

In the following detailed description, the embodiments of the present invention have been shown and described. As will be realized, the invention is capable of modification in various obvious respects, all without departing from the invention. Accordingly, the drawings and description are to be regarded as illustrative in nature, and not restrictive.

Figure 1:
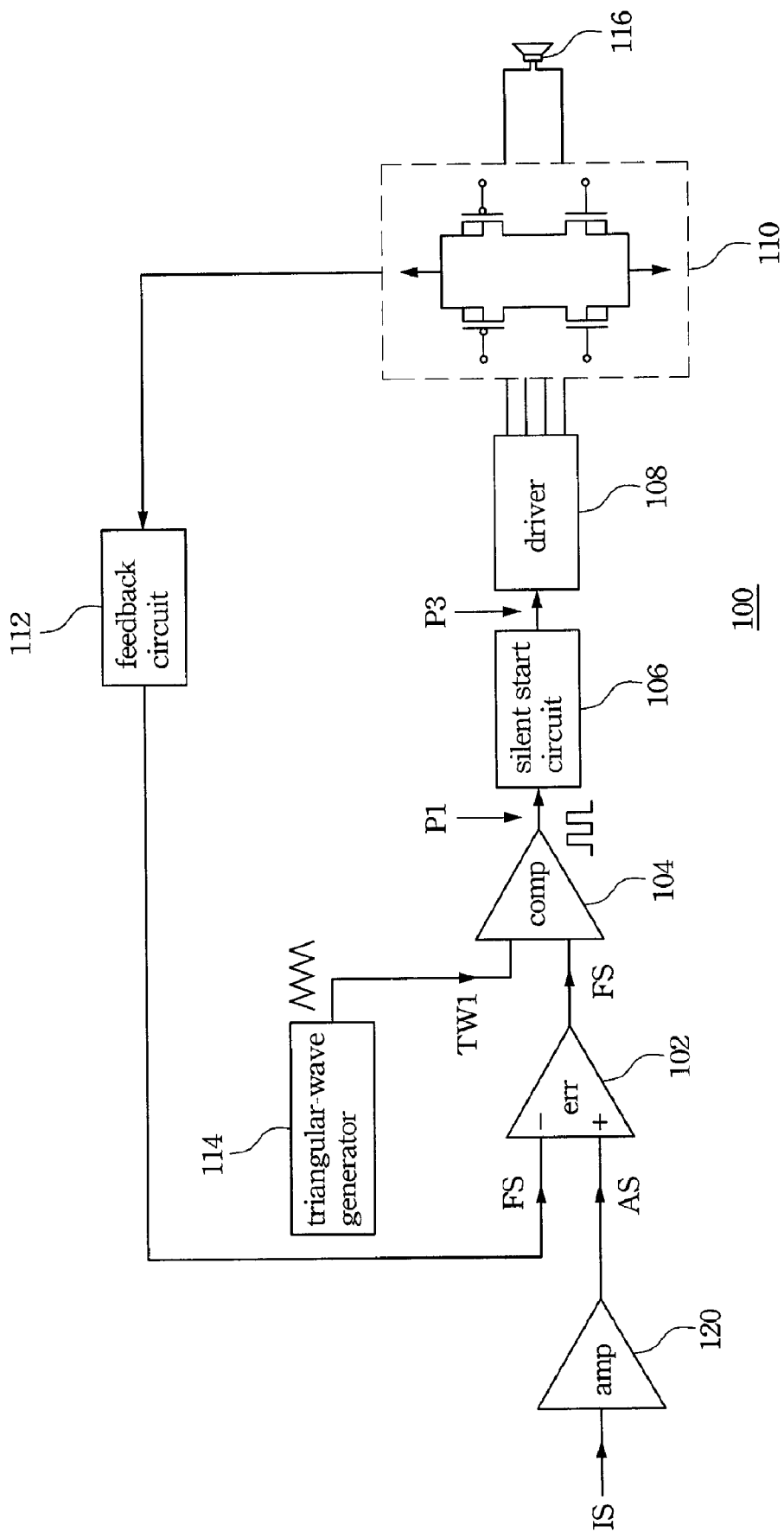
FIG. 1 illustrates a class D audio amplifier according to one embodiment of the present invention.

FIG. 1 illustrates a class D audio amplifier according to one embodiment of the present invention. The class D audio amplifier 100 includes an error amplifier 102, a comparator 104, a silent start circuit 106, a driver 108, a bridge circuit 110 and a feedback circuit 112. The error amplifier 102 generates an error signal ES by amplifying a difference between a feedback signal FS and an audio input signal AS, in which the audio input signal AS can be transferred from an input signal IS by a preset amplifier 120. The comparator 104 generates a first pulse width modulation (PWM) signal P1 by comparing a first triangular-wave signal TW1 and the error signal ES, in which the first triangular-wave signal TW1 can be generated by a triangular-wave generator 114. The silent start circuit 106 performs AND operation of the first PWM signal P1, which is generated by the comparator 104, and a second PWM signal P2 to generate a third PWM signal P3. The bridge circuit 110 has switches alternately conducting a current flowing into and from a load 116. The driver 108 is controlled with the third PWM signal P3, which is generated by the silent start circuit 106, to control the switches of the bridge circuit 110. The feedback circuit 112 generates the feedback signal FS indicating a condition of the load 116 and transmits the feedback signal FS to the error amplifier 102.

Figure 2:
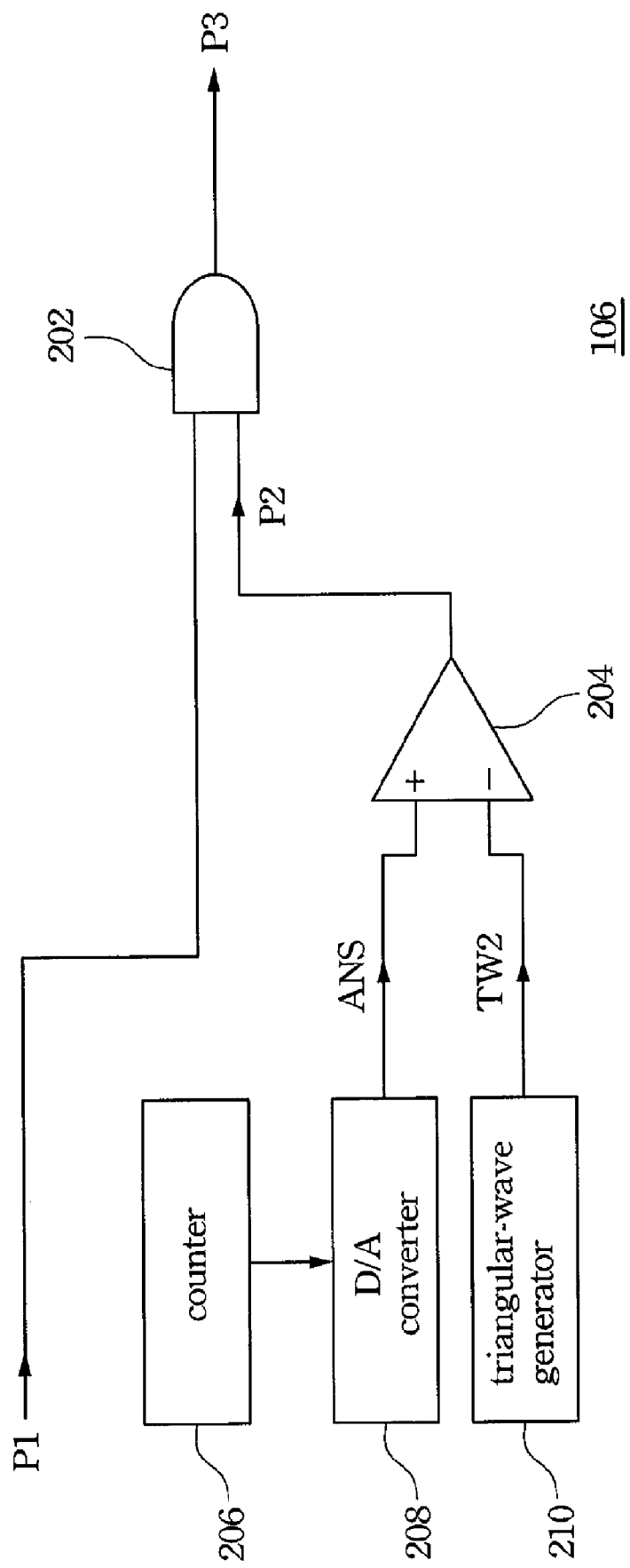
FIG. 2 illustrates the silent start circuit shown in FIG. 1.

FIG. 2 illustrates the silent start circuit shown in FIG. 1. The silent start circuit 106 includes an AND gate 202, an integrator 204, a counter 206, a digital-to-analog (D/A) converter 208 and a triangular-wave generator 210. The counter 206 generates a digital signal and transmits the digital signal to the D/A converter 208. The D/A converter 208 converts the digital signal into an analog signal ANS, and transmits the analog signal ANS to the integrator 204. The triangular-wave generator 210 generates a second triangular-wave signal TW2, and transmits the second triangular-wave signal TW2 to the integrator 204. The integrator 204 generates the second PWM signal P2 by integrating the analog signal ANS, which is output from the D/A converter 208, and the second triangular-wave signal TW2, which is generated by the triangular-wave generator 210, in which the second PWM signal P2 has a gradually increased duty ratio. The integrator 204 can be a comparator which is generating the second PWM signal P2 by comparing the analog signal ANS and the second triangular-wave signal TW2. The AND gate 202 performs the AND operation of the first PWM signal P1, which is generated by the comparator 104, and the second PWM signal P2, which is generated by the integrator 204, to generate the third PWM signal P3. It is not limited to use the AND gate 202 in the silent start circuit 106. Any circuit or device which performs the AND operation of the first PWM signal P1 and the second PWM signal P2 can be used in the silent start circuit 106.

Figure 3:
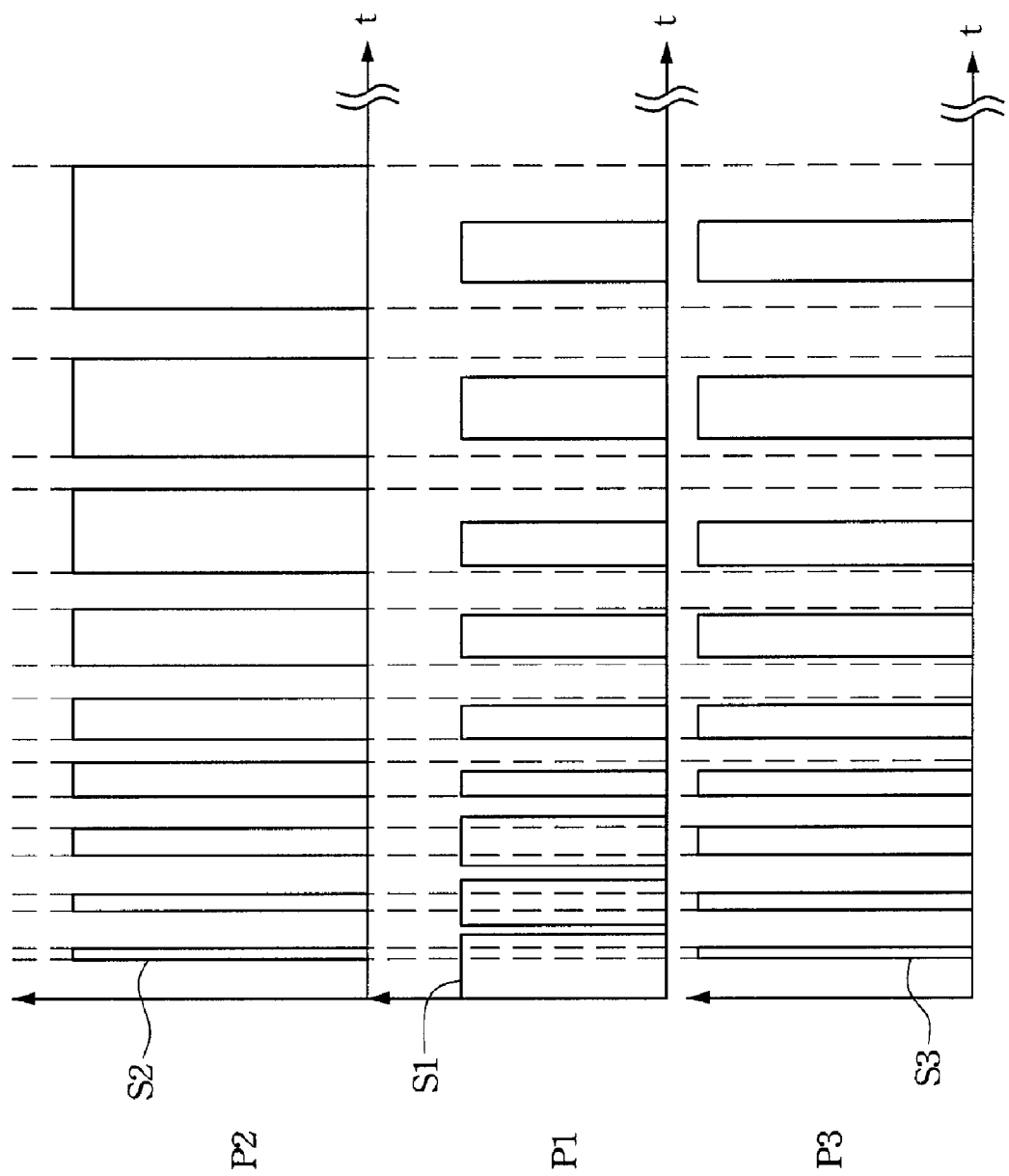
FIG. 3 illustrates a waveform diagram of the first, second and third PWM signal of the class D audio amplifier according to one embodiment of the present invention.

FIG. 3 illustrates a waveform diagram of the first, second and third PWM signal of the class D audio amplifier according to one embodiment of the present invention. As shown in FIG. 3, the first PWM signal P1, which is generated by the comparator 104, has pulses with irregular widths. The second PWM signal P2, which is generated by the integrator 204, has a gradually increased duty ratio; that is, the second PWM signal P2 has pulses with regular and gradually increased widths as time goes by. The third PWM signal P3, which is generated by the AND gate 202, is the result of the AND operation of the first PWM signal P1 and the second PWM signal P2. Taking for example the AND operation of the first pulse of the first PWM signal P1, i.e. S1, and the first pulse of the second PWM signal P2, i.e. S2, the first pulse of the third PWM signal P3, i.e. S3, is the result of the AND operation of the signals S1 and S2. Since the second PWM signal P2 has pulses with regular and gradually increased widths, the third PWM signal P3 also has pulses with regular and gradually increased widths based on the AND operation.

As a result, when the power is turned on to start the audio power amplifier 100, the third PWM signal P3, which has a gradually increased duty ratio, can thus be generated and transmitted to the driver 108 to stably control the bridge circuit 110, so that the load 116 is not damaged because of the DC current suddenly conducted by the bridge circuit 110, and the popping noise which is produced at the same time based on the suddenly conducted DC current can therefore be reduced as well.

For the foregoing embodiments of the present invention, the class D audio amplifier can be applied, when the audio amplifier starts, to avoid the suddenly generated overly high DC current therein, to prevent the load, i.e. loudspeaker, from being damaged, and to reduce the popping noise based on the suddenly generated overly high DC current.

As is understood by a person skilled in the art, the foregoing embodiments of the present invention are illustrative of the present invention rather than limiting of the present invention. It is intended to cover various modifications and similar arrangements included within the spirit and scope of the appended claims, the scope of which should be accorded the broadest interpretation so as to encompass all such modifications and similar structures.

What is claimed is:

1. A class D audio amplifier, comprising:
    an error amplifier generating an error signal by amplifying a difference between a feedback signal and an audio input signal;
    a comparator generating a first pulse width modulation (PWM) signal by comparing a first triangular-wave signal and the error signal;
    a bridge circuit having switches for alternately conducting a current flowing into and from a load;
    a feedback circuit for generating the feedback signal indicating a condition of the load; and
    a silent start circuit for transforming the first PWM signal into a PWM signal having a gradually increased duty ratio, for control of the switches of the bridge circuit.

2. The class D audio amplifier as claimed in claim 1, wherein the silent start circuit further comprises:
    an AND gate for performing AND operation of the first PWM signal and a second PWM signal having another gradually increased duty ratio.

3. The class D audio amplifier as claimed in claim 1, wherein the silent start circuit further comprises:
    an integrator generating the second PWM signal by integrating an analog signal and a second triangular-wave signal.

4. The class D audio amplifier as claimed in claim 3, wherein the integrator is a second comparator generating the second PWM signal by comparing the analog signal and the second triangular-wave signal.

5. The class D audio amplifier as claimed in claim 3, wherein the silent start circuit further comprises:
    a digital-to-analog converter for converting a digital signal into the analog signal.

6. The class D audio amplifier as claimed in claim 5, wherein the silent start circuit further comprises:
    a counter for generating the digital signal.

7. The class D audio amplifier as claimed in claim 1, further comprising:
    a driver controlled with the PWM signal to control the switches of the bridge circuit.

\* \* \* \* \*